US011223152B2

(12) United States Patent
Taylor et al.

(10) Patent No.: US 11,223,152 B2
(45) Date of Patent: Jan. 11, 2022

(54) INTERPOSER ASSEMBLY AND METHOD

(71) Applicant: Amphenol InterCon Systems, Inc., Etters, PA (US)

(72) Inventors: Paul R. Taylor, Mechanicsburg, PA (US); Trent Do, Lititz, PA (US); James S. Hileman, Carlisle, PA (US)

(73) Assignee: Amphenol InterCon Systems, Inc., Etters, PA (US)

( * ) Notice: Subject to any disclaimer, the term of this patent is extended or adjusted under 35 U.S.C. 154(b) by 0 days.

(21) Appl. No.: 16/797,536

(22) Filed: Feb. 21, 2020

(65) Prior Publication Data

US 2020/0274277 A1 Aug. 27, 2020

Related U.S. Application Data

(60) Provisional application No. 62/808,934, filed on Feb. 22, 2019.

(51) Int. Cl.
| | | |
|---|---|---|
| *H01R 13/24* | (2006.01) | |
| *H01L 23/00* | (2006.01) | |
| *H05K 1/11* | (2006.01) | |
| *H01R 12/73* | (2011.01) | |
| *H01R 12/70* | (2011.01) | |

(52) U.S. Cl.
CPC ......... *H01R 13/2442* (2013.01); *H01L 24/14* (2013.01); *H01R 13/2435* (2013.01); *H05K 1/11* (2013.01); *H01R 12/7082* (2013.01); *H01R 12/73* (2013.01)

(58) Field of Classification Search
CPC ............ H01R 13/2435; H01R 13/2464; H01R 12/52; H01L 24/14; H05K 1/11
See application file for complete search history.

(56) References Cited

U.S. PATENT DOCUMENTS

| | | | |
|---|---|---|---|
| 5,653,598 A | 8/1997 | Grabbe | |
| 6,149,443 A | 11/2000 | Moran | |
| 6,176,707 B1 | 1/2001 | Neidich et al. | |
| 6,488,513 B1 | 12/2002 | Neidich et al. | |
| 6,533,590 B1 | 3/2003 | Lee et al. | |
| 6,832,917 B1 | 12/2004 | Neidich | |
| 6,898,087 B1 | 5/2005 | Chen | |
| 6,921,270 B2 | 7/2005 | Mendenhall et al. | |
| 6,929,488 B2 | 8/2005 | Kung et al. | |
| 6,957,964 B2 | 10/2005 | Chiang | |
| 7,052,284 B2 | 5/2006 | Liao et al. | |
| 7,128,622 B2 * | 10/2006 | Tsai ................... | H01R 12/7076 439/874 |
| 7,140,886 B1 | 11/2006 | Chen | |
| 7,150,632 B2 | 12/2006 | Lee et al. | |
| 7,160,115 B2 | 1/2007 | Huang et al. | |
| 7,252,563 B2 | 8/2007 | Ju | |
| 7,341,485 B2 | 3/2008 | Polnyi | |
| 7,422,439 B2 | 9/2008 | Rathbum et al. | |
| 7,455,556 B2 | 11/2008 | Mendenhall et al. | |

(Continued)

FOREIGN PATENT DOCUMENTS

CN 1619887 A 5/2005

*Primary Examiner* — Briggitte R. Hammond
(74) *Attorney, Agent, or Firm* — Hooker & Habib, P.C.

(57) ABSTRACT

An interposer assembly including a plate and a plurality of conductive contacts extending through plate passages for forming electrical connections with pads on overlying and underlying substrates.

35 Claims, 10 Drawing Sheets

(56) References Cited

U.S. PATENT DOCUMENTS

| | | | |
|---|---|---|---|
| 7,621,755 B2 | 11/2009 | Kubo et al. | |
| 7,625,216 B2 | 12/2009 | Mendenhall et al. | |
| 7,682,165 B2 | 3/2010 | Liao | |
| 7,828,562 B2 | 11/2010 | Wu | |
| 7,891,983 B2 | 2/2011 | Ichimura et al. | |
| 8,016,623 B2 | 9/2011 | Ju | |
| 8,044,502 B2 | 10/2011 | Rathbum | |
| 8,052,436 B1 | 11/2011 | Ju | |
| 8,052,454 B2 | 11/2011 | Polnyi | |
| 8,221,172 B2 | 7/2012 | Ju et al. | |
| 8,360,790 B2 * | 1/2013 | Ju | H01R 43/0235 439/83 |
| 8,414,311 B2 | 4/2013 | Ju | |
| 8,608,491 B2 * | 12/2013 | Hsu | H01R 13/24 439/83 |
| 8,894,423 B2 | 11/2014 | Mongold et al. | |
| 8,899,993 B2 | 12/2014 | Taylor | |
| 9,425,525 B2 * | 8/2016 | Walden | H01R 12/7082 |
| 10,003,150 B1 | 6/2018 | Ju et al. | |
| 10,116,080 B1 * | 10/2018 | Ju | H01R 12/7082 |
| 10,135,199 B1 | 11/2018 | Ju | |
| 10,566,712 B2 | 2/2020 | Beaman | |
| 2005/0174746 A1 | 8/2005 | Hsiao et al. | |
| 2016/0006149 A1 | 1/2016 | Fazelpour et al. | |
| 2016/0087360 A1 | 3/2016 | Walden et al. | |
| 2017/0256876 A1 | 9/2017 | Zhou et al. | |

\* cited by examiner

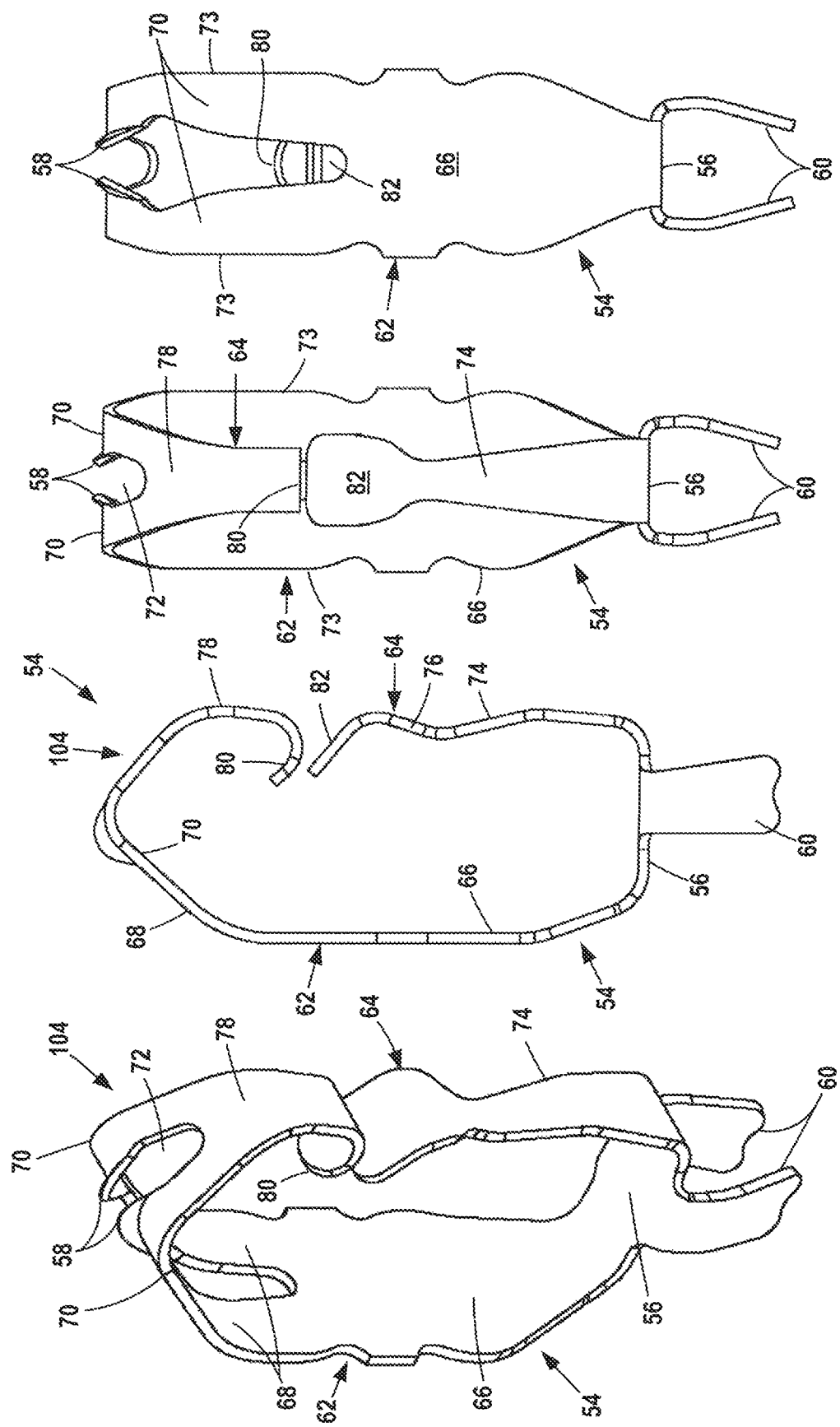

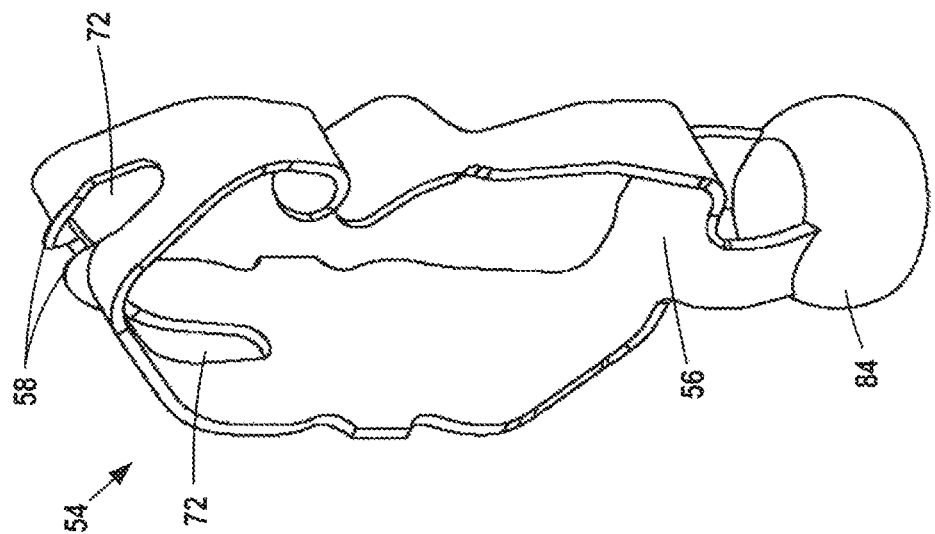
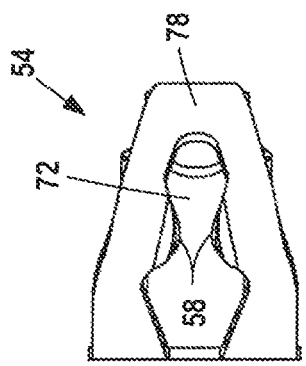
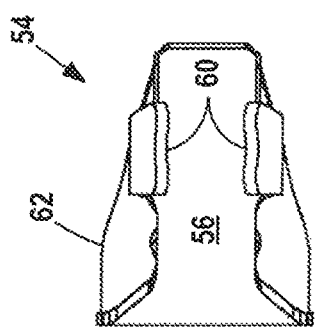

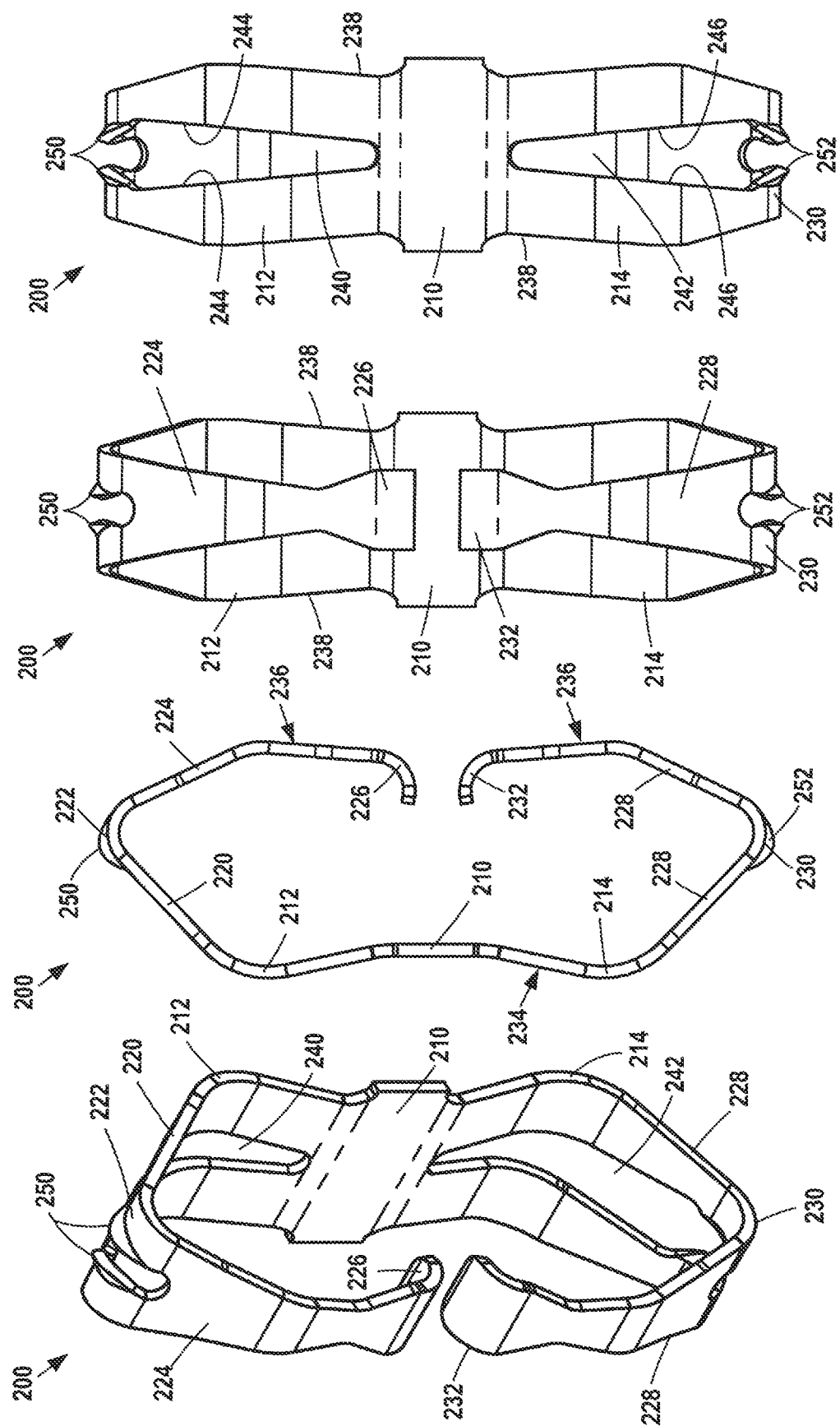

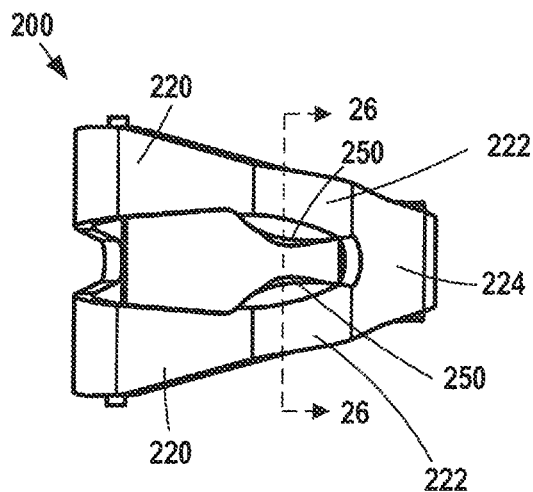
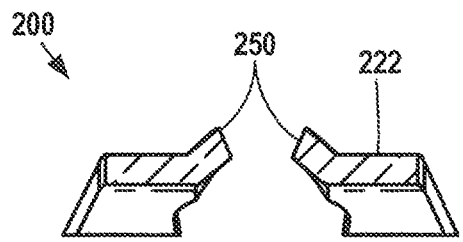
Fig. 25        Fig. 26
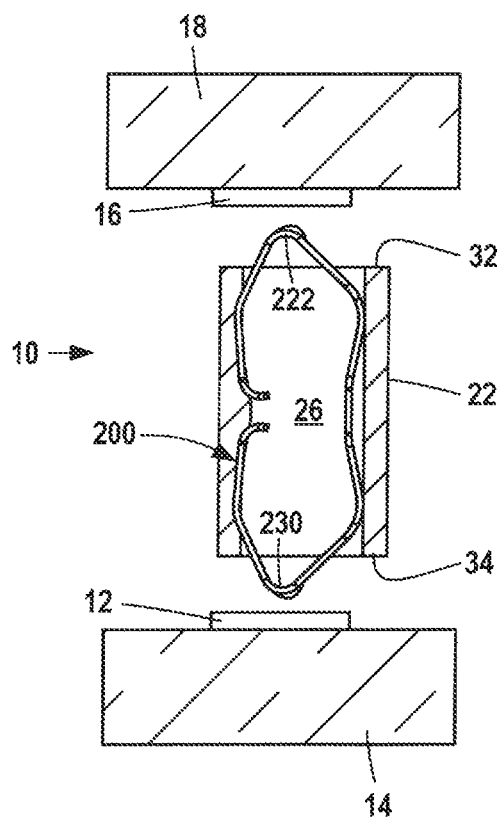
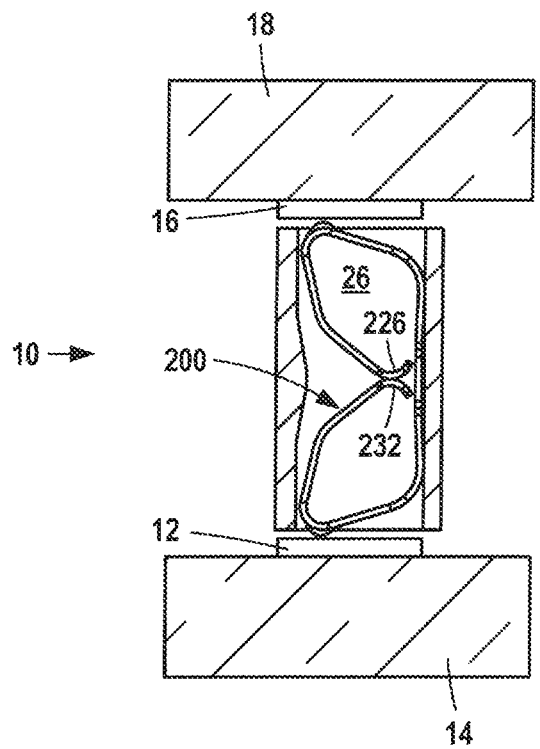
Fig. 27        Fig. 28

INTERPOSER ASSEMBLY AND METHOD

FIELD OF THE DISCLOSURE

The disclosure relates to an interposer assembly including a plate and a plurality of conductive contacts located in plate through-passages. The contacts allow the formation of electrical connections between contact pads on opposed overlying and underlying substrates. The contacts may include one or more cantilever arms to facilitate forming electrical connections with the contact pads.

BACKGROUND OF THE DISCLOSURE

Interposer assemblies with molded plastic plates and metal contacts inserted in passages in the plates are used for forming electrical connections between contact pads on opposed substrates. The contacts and pads are spaced very close together in land grid array rows and columns to establish a large number of differential pair signal and ground connections extending through the plate.

Conventional interposer assemblies include contacts having opposed ends which form pressure connections with pads on substrates. Permanent soldered connections may connect the contacts to pads on one substrate.

It is desirable for the interposer assembly contacts to form reliable electrical connections between opposed substrate pads.

Interposer assembly contacts include contact surfaces which mechanically engage substrate contact pads and form electrical connections with the contact pads. Conventional interposer assemblies have single surface contacts which engage each pad to form a single electrical connection with each pad. The contact may wipe along the pad to improve the quality of the electrical connection. Impurities, oxides or contaminants on either the contact surface or the pad can impair formation of the electrical connection between the contact surface and the pad.

Contacts used in interposer assemblies may include a separate spring element to bias a single contact surface against a pad.

Accordingly, there is a need for an improved interposer assembly in which each contact makes redundant contacts with each pad so that each contact establishes two reliable electrical connections with each pad. The connections should have small contact areas to increase the contact pressure between the contact and the pad.

SUMMARY OF THE DISCLOSURE

The disclosed interposer assembly has an improved interposer plate and contacts for forming electrical connections between pads on opposed substrates.

The disclosed interposer assembly includes contacts having one or more cantilever arms that form redundant contacts with a substrate pad. Each cantilever arm includes a pair of contact points extending away from the cantilever arm. The contact points establish reliable electrical connections with each pad. The contact areas between the contact points and the contact pads are small in order to increase the contact pressure between the contact and the pad and to assure reliable formation of an electrical connection.

In embodiments, the disclosed pair of contact points are located at the inner portion of each cantilever arm to establish reliable electrical connections at or near the central portion of a corresponding contact pad. This feature provides for reliable location of the electrical connections at each pad for improved electrical connection formation.

In other embodiments, assembly contacts may have an elongate U-shaped body with opposed sides and opposed top and bottom connection ends. The top ends form shunting or redundant, disengageable electrical connections with the pads on an upper substrate. The bottom ends form electrical connections with pads on a lower substrate.

In other embodiments, solder balls may be physically attached to the bottom ends of the contacts after the contacts are inserted into cavities in the plate to form permanent reflowed solder connections between the bottom contact ends and pads on the lower substrate.

The contact in each passage forms electrical connections with pads on the overlying and underlying substrates. Movement of the upper substrate toward the top surface of the interposer assembly plate engages and vertically compresses the contacts into the passages. During initial downward movement of the upper substrate toward the plate, the upper ends of the contacts engage the pads on the overlying substrate, wipe along the pads, and are compressed into the passages in the plate sufficiently to form electrical connections with the contact pads on the substrate, provided that the upper substrate is not deformed by the large force generated by compression of the large number of contacts in the assembly and provided that manufacturing tolerances do not prevent formation of the connections.

Initial movement of the upper substrate toward the plate compresses the contacts in the plate at a high spring rate. Further movement of the substrate toward the plate to assure all contacts are compressed further, despite bowing and manufacturing tolerances, further compresses all contacts. During the further compression movement, all contacts are compressed at a lower or reduced spring rate to assure electrical connections with all contacts. The reduced spring rate during final movement of the upper substrate toward and onto the interposer plate reduces the compression load on the assembly and the need for very strong clamps to compress the assemblies and retain the compressed assemblies together.

Other objects and features of the disclosure will become apparent as the description proceeds, especially when taken in conjunction with the accompanying drawing sheets illustrating the assembly.

DESCRIPTION OF THE DRAWINGS

FIG. 5 is a perspective view of a contact member;

FIG. 6 is a side view of a contact member;

FIG. 7 is a front view of a contact member;

FIG. 8 is a back view of a contact member;

FIG. 9 is a bottom view of a contact member;

FIG. 10 is a top view of a contact member;

FIG. 11 is a perspective view of the contact member shown in FIGS. 5-11 with a solder ball element;

FIG. 21 is a perspective view of an alternate embodiment contact member;

FIG. 22 is a side view of the alternate embodiment contact member of FIG. 21;

FIG. 23 is a front view of the alternate embodiment contact member of FIG. 21;

FIG. 24 is a rear view of the alternate embodiment contact member of FIG. 21;

FIG. 25 is a top view of the alternate embodiment contact member of FIG. 21;

FIG. 26 is a sectional view taken generally along line 26-26 of FIG. 25;

FIG. 27 is a sectional view through an interposer assembly including the alternate embodiment contact member of FIG. 21 and upper and lower substrates before the formation of electrical connections;

FIG. 28 is a sectional view through an interposer assembly including the alternate embodiment contact member of FIG. 21 and upper and lower substrates after the formation of electrical connections;

DESCRIPTION OF PREFERRED EMBODIMENTS

Figure 2:
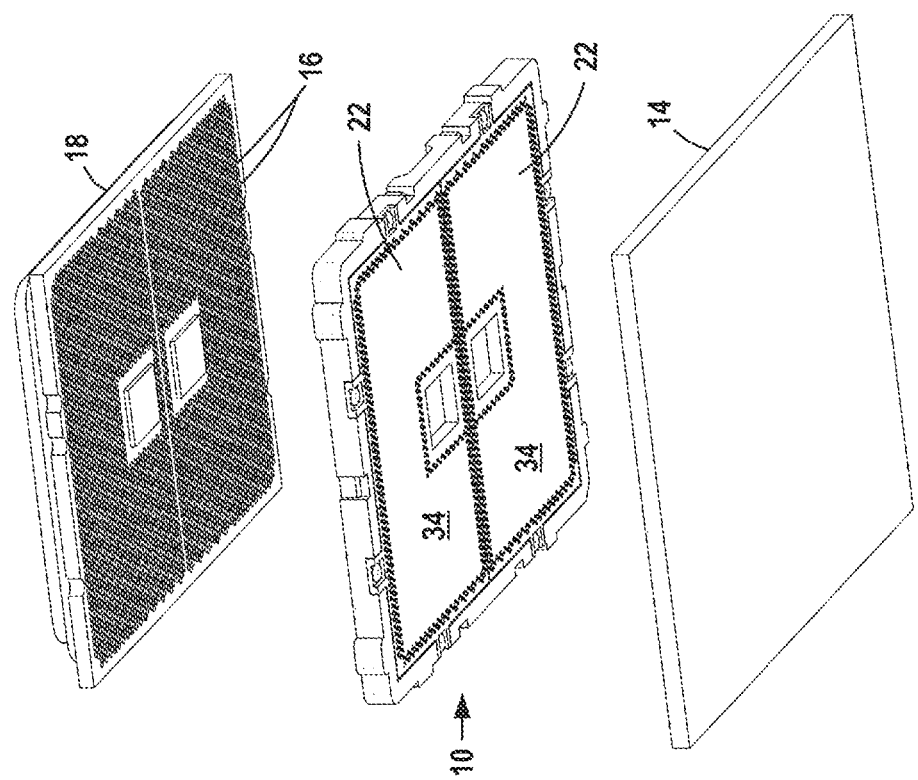
FIG. 2 is an alternate exploded perspective view of an interposer assembly, upper and lower substrates and an interposer plate between the substrates.
Figure 1:
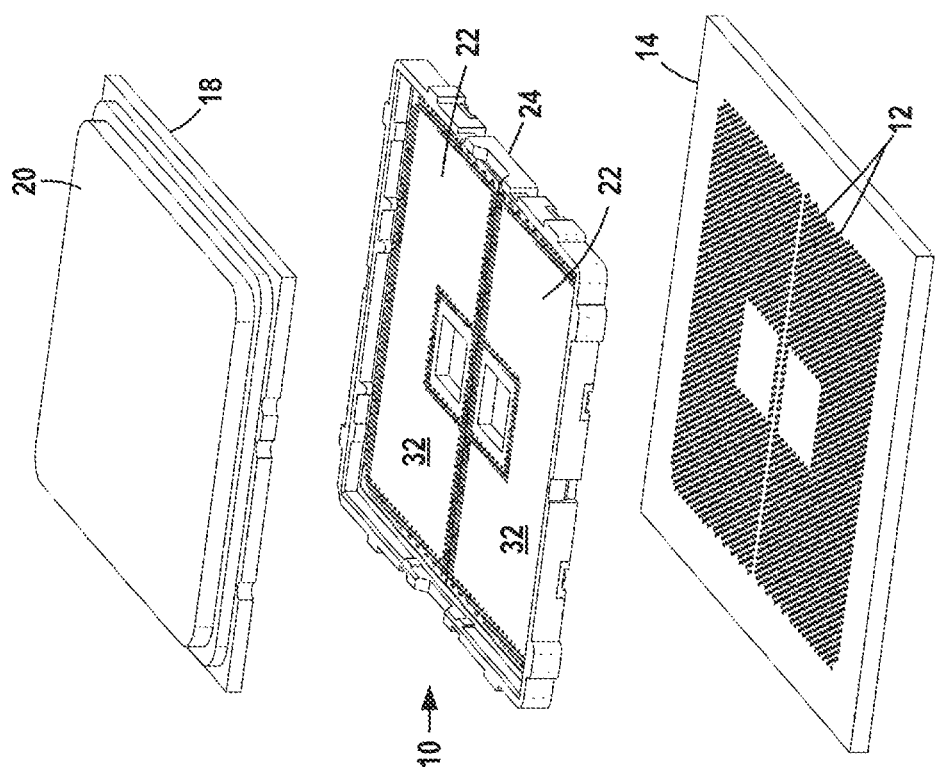
FIG. 1 is an exploded perspective view of an interposer assembly, upper and lower substrates and an interposer plate between the substrates.
Figure 4:
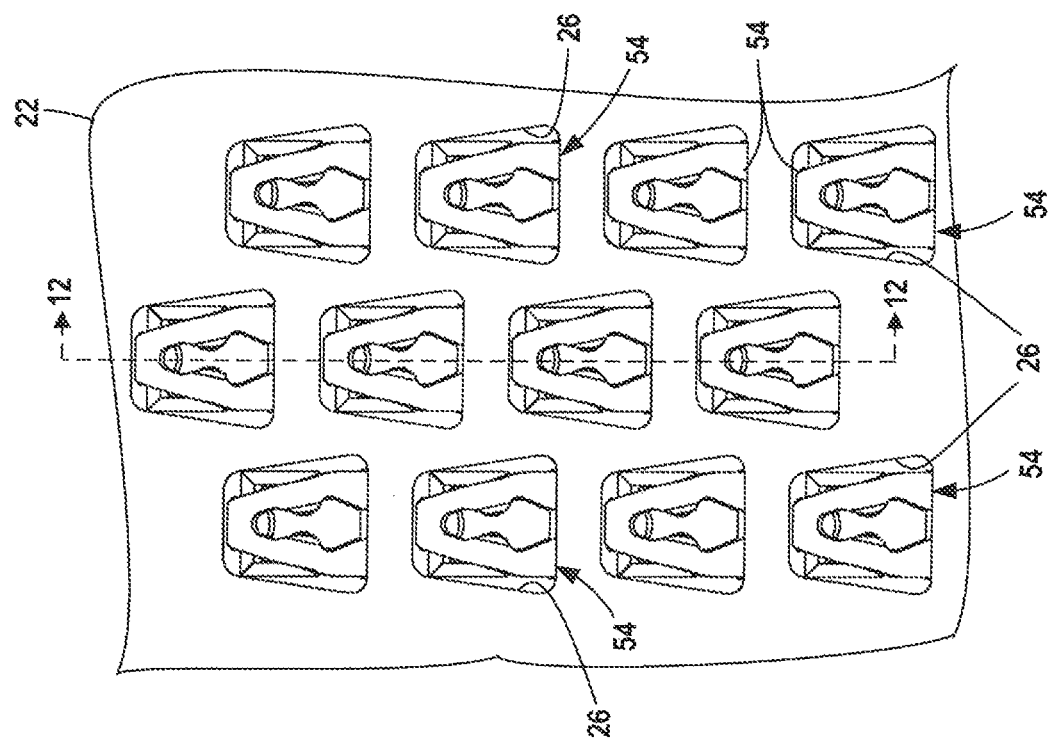
FIG. 4 is a top view of a portion of an interposer assembly showing an insulating plate and a number of contact members.
Figure 3:
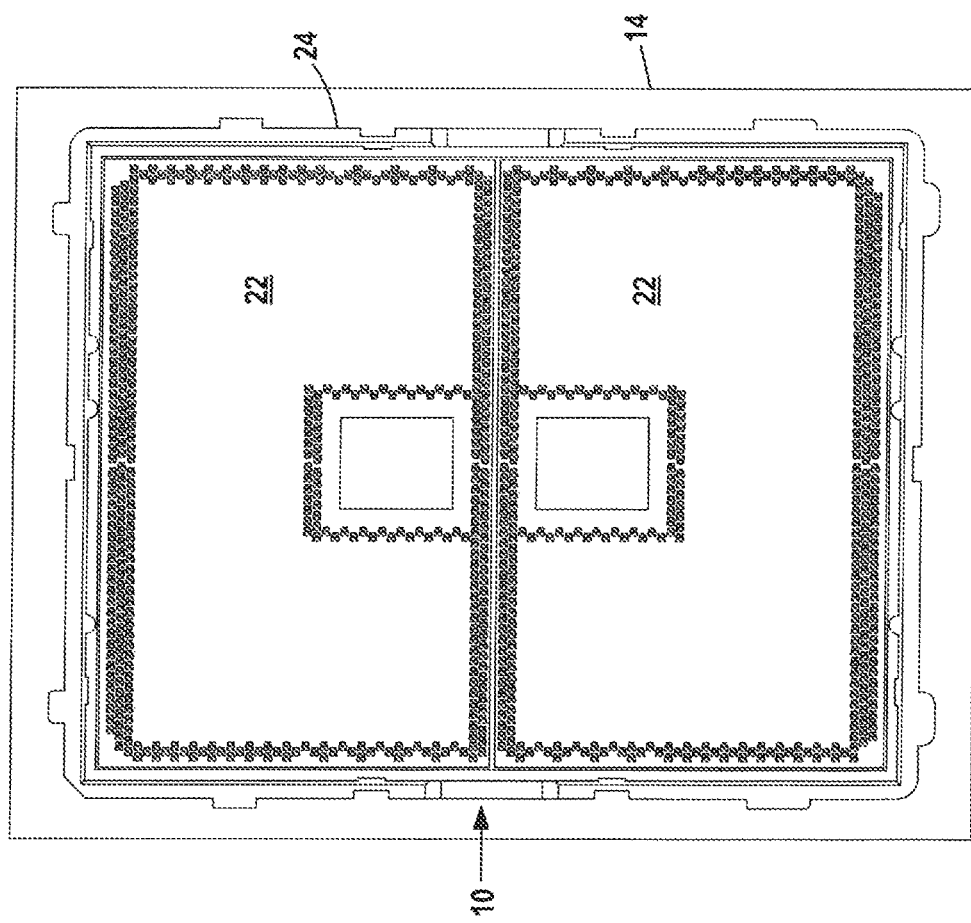
FIG. 3 is a top view of the interposer assembly in an alignment frame.

Interposer assembly 10 forms electrical connections between a large number of contact pads 12 on lower substrate 14 and a correspondingly large number of contact pads 16 on upper substrate 18. The pads 12 and 16 are arranged in rows and columns in land grid arrays. An integrated circuit 20 may be mounted on the upper surface of substrate 18 with electrical connections to pads 16. Substrate 18 is removably mounted on assembly 10. Assembly 10 may be permanently mounted on substrate 14.

Interposer assembly 10 includes two rectangular molded insulating, plastic interposer plates 22 fitted in surrounding frame 24. Each plate 22 has a large number of closely spaced contact passages 26 arranged in a closely spaced land grid array. A two-conductor contact 54 is positioned in each contact passage 26 to form a reliable dual current path electrical connection between opposed contact pads 12 and 16 on substrates 14 and 18. Pads 12 and 16 are located below and above each passage 26. Contacts 54 extend generally perpendicularly between plate top surface 32 and plate bottom surface 34.

Figure 17:
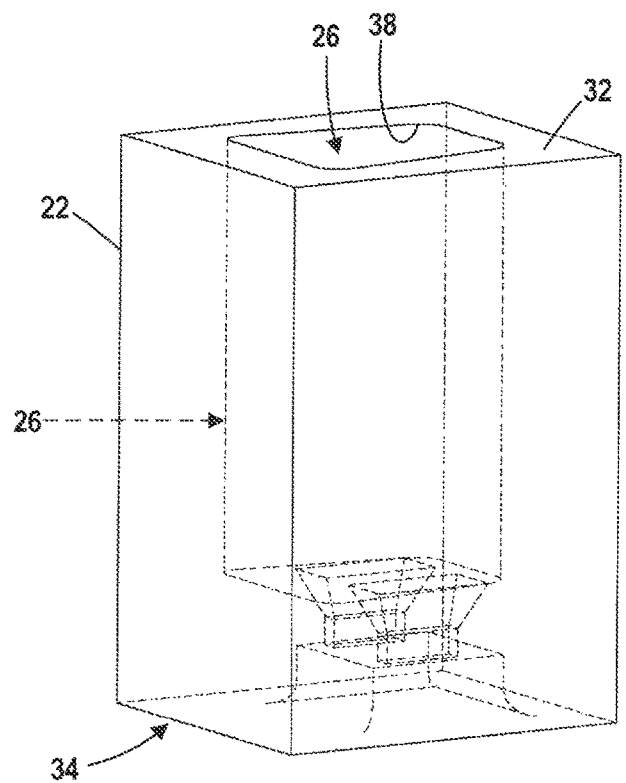
FIG. 17 is a perspective view of an interposer plate passage.
Figure 18:
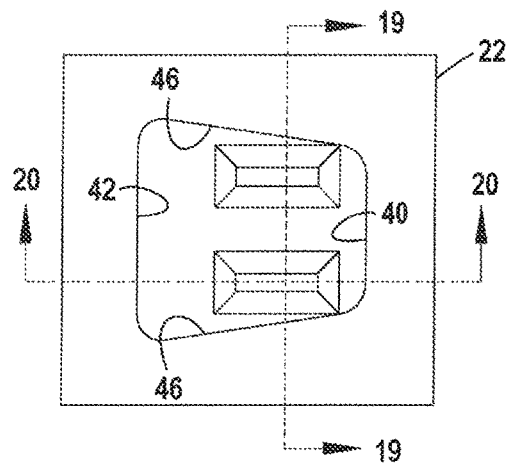
FIG. 18 is a top view of an interposer plate passage.
Figure 19:
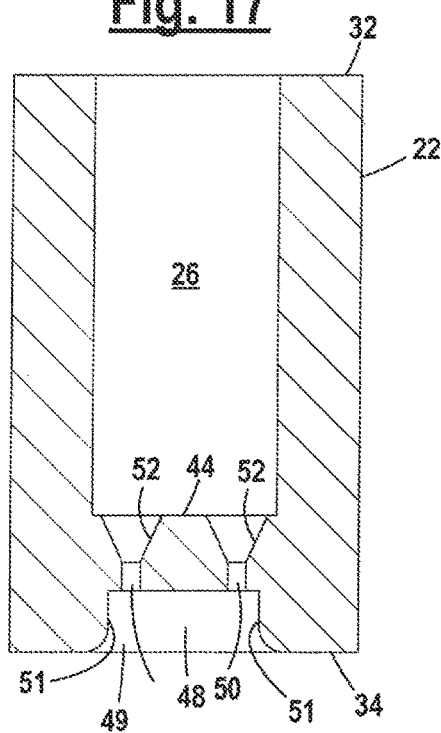
FIG. 19 is a sectional view taken generally along line 19-19 of FIG. 18.
Figure 20:
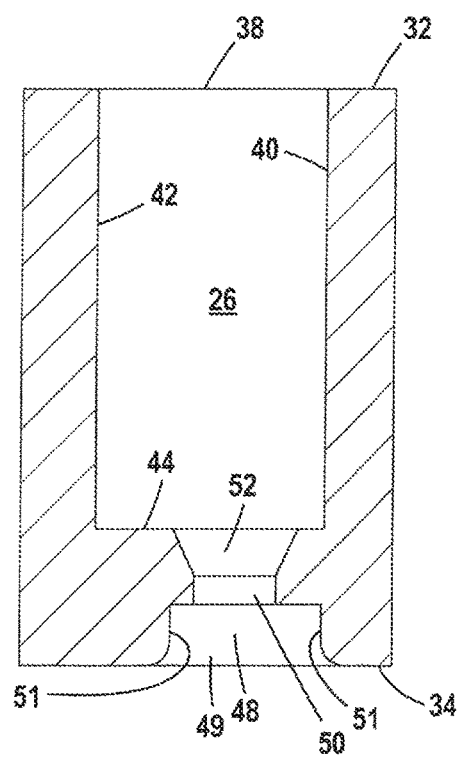
FIG. 20 is a sectional view taken generally along line 20-20 of FIG. 18.

As shown in FIGS. 17-20, each passage 26 has a trapezoidal mouth 38 at top surface 32, opposed, parallel sidewalls 40 and 42 extending from mouth 38 perpendicularly away from top surface 32 to a trapezoidal bottom wall 44 spaced above plate bottom surface 34. Tapered sidewalls 46 extend between the sides of walls 40 and 42 so that passage 26 has a uniform trapezoidal transverse cross-section as shown in FIGS. 17 and 18. In embodiments, a solder recess or pocket 48 is located in plate bottom surface 34 below each terminal passage 26. A pair of tab passages 50 extend from bottom wall 44 to solder recess 48. Tapered wide ends 52 at the upper ends of passages 50 open into contact passage 26. Solder recess or pocket 48 may have a mouth 49 that is wider than solder recess 48, as allowed by generally outwardly extending solder recess walls 51.

A two-conductor ball grid array contact 54 is positioned in each contact passage 26. Contact 54 is shown in FIGS. 5-11. Contact 54 is formed from strip metal stock which may be beryllium copper and may be plated with a conductive metal, which may be gold or a gold alloy. Contact 54 includes a contact base 56 at the lower end of the contact and a pair of rounded contact points 58 at the top of the contact. Two solder tabs 60 extend down from opposed sides of base 56. Tabs 60 are bent inwardly toward each other as shown in FIGS. 7-9.

Continuous one-piece metal conductor 62 extends up from contact base 56 to points 58 along one side of contact 54. Discontinuous two-piece metal conductor 64 extends up from contact base 56 to contact points 58 along the other side of contact 54 away from conductor 62. See FIG. 6.

Conductor 62 includes wide continuous metal strip 66 extending up from base 56 to lower portions 68 of two V-shaped strips 70 above strip 66.

Contact points 58 are located on strips 70 at the top of contact 54. Contact points 58 extend upwardly from strips 70 adjacent an elongate slot 72 formed between the strips.

Contact points 58 are located at the interior of contact 54, away from the contact opposed sides 73.

Continuous conductor 62 extends from base 56, up and along strip 66 and along V-shaped strips 70 to points 58 at the upper end of contact 54. See FIG. 8.

Discontinuous conductor 64 includes a flexible, narrow metal strip 74 which extends up from base 56 on the side of contact 54 away from conductor 62, and short, narrow strip 78, which extends down from the ends of strips 70 on the side of contact 54 away from conductor 62 to inwardly and upwardly rounded end 80. End 80 is located a short distance above flat follower 82 at the upper end of arm 76. Follower 82 on the upper end of arm 76 slopes upwardly at an angle 100 of about 45° from the plane of plate 22 when contact 54 is not compressed. See FIG. 12.

Strips 70, strip 78 and end 80 comprise a contact cantilever spring arm 104 having contact points 58. Cantilever spring arm 104 is bent elastically during contact compression to provide high contact pressure at contact points 58 against substrate pads 16.

During manufacture of assembly 10, contacts 54 are inserted freely into passages 26 with wide strips 66 flush on wide sidewalls 42 and narrow strips 74 and 78 extending along and spaced inwardly a short distance from narrow sidewalls 40. The contacts are not compressed during insertion in passages 26.

During contact insertion, solder tabs 60 extend into and through lead ends 52 of passages 50 and project into solder recesses 48. The inward tapers on tabs 60 hold the contacts in passages 26 after insertion. Solder balls 84 are then pressed into recesses 48 to form physical connections with the lower ends of the tabs. Tabs 60 and solder balls 84 hold the contacts in the passages.

Plate 22, with contacts and solder balls in place, is then positioned on lower substrate 14, and the solder balls are heated and reflowed to form a reliable soldered electrical connection 92 between each contact and its corresponding pad 12 on substrate 14.

Figure 12:
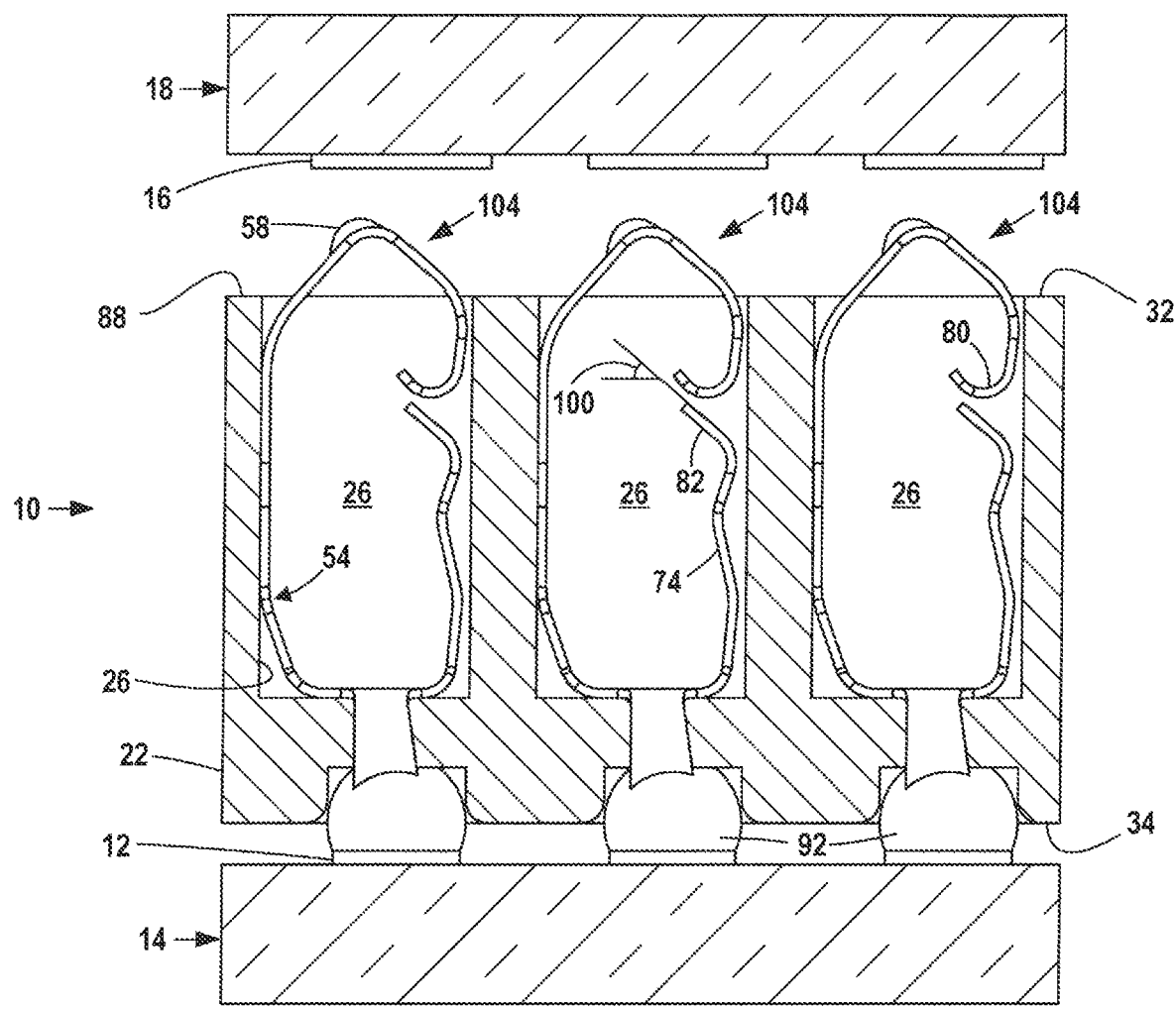
FIG. 12 is a sectional view taken generally along line 12-12 of FIG. 4 through the interposer assembly and the upper and lower substrates before the formation of electrical connections.

After plate 22 is mounted on lower substrate 14 as shown in FIG. 12, upper substrate 18 is positioned above plate 22 with contact pads 16 above contacts 54 in passages 26 in plate 22. Strips 70 and points 58 extend above plate upper surface 32.

Figure 13:
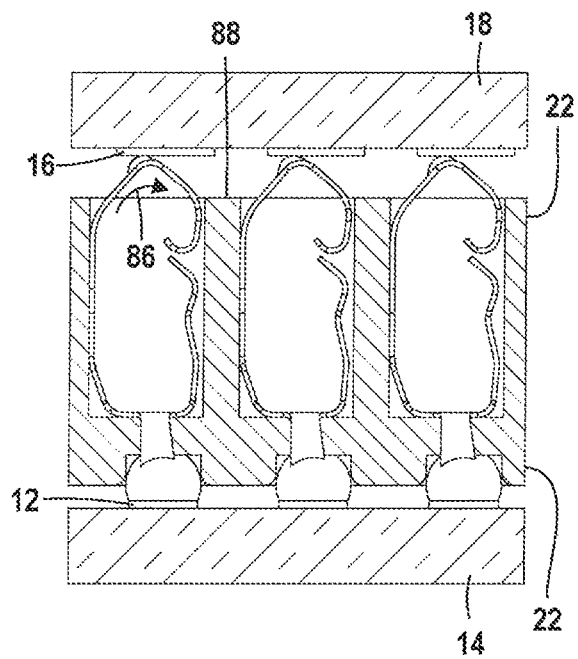
FIGS. 13 through 16 are sectional views like FIG. 12 showing movement of the upper substrate toward the lower substrate and compression of the contact members to form electrical connections.
Figure 14:
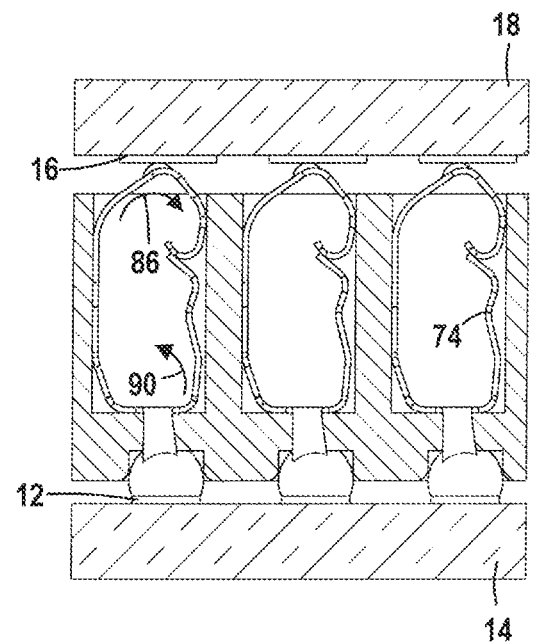

Upper substrate 18 is then moved vertically down during initial compression so that pads 16 engage contact points 58 on the upper ends of contacts 54. See FIGS. 12 and 13. Further lowering of substrate 18 vertically compresses each two-conductor contact 54 by rotating strips 70 and joined vertical strips 66 into passage 26 and sliding points 58 along pads 16 in a direction away from sidewalls 42. The upper ends of strips 66, V-shaped strips 70 and strips 78 of conductor 64 are rotated away from walls 42 in clockwise direction 86 shown in FIG. 14 as upper substrate 18 is moved down toward plate 22. During rotation of strips 66 and 70, contact points 58 are wiped along pads 16 to form reliable, redundant electrical connections between the contacts and the pads.

Short strips 78 joining the ends of strips 70 away from strips 66 are pushed against and slide down narrow cavity sidewalls 40 to bend the upper portion of the contact elastically, as shown in FIGS. 13-16. Simultaneously with this bending, rounded free ends 80 of strips 78 engage the tops of sidewalls 40 and engage flat followers 82 on the upper ends of arms 76 and are moved along the sidewalls and surfaces as they are rotated in clockwise direction 86 into the passages away from walls 42 and engage followers 82 at the upper ends of vertical and relatively stiff strips 74. Followers 82 extend out an angle 100 of about 45° to the horizontal. Vertical strips 74 support followers 82 against lateral deflection by initial engagement with rounded ends 80 as the upper portions of the contacts are compressed and rotated into the upper portions of passages 26.

The upper ends of contacts 54 are relatively stiff and resist vertical compression to increase the normal forces at the pads and to form reliable electrical connections with the pads. See FIGS. 14 and 15. During initial vertical compression of contacts 54 by upper substrate 18, the contacts are vertically compressed at a high spring rate to establish electrical connections with pads 16.

Each contact 54 forms a two-current path electrical connection between opposing pairs of pads on the upper and lower substrates. Wiped pressure connections are maintained between two strips 66 and 78 of discontinuous conductor 64 to promote current flow.

Due to manufacturing tolerances and possible bowing of mated circuit boards, initial compression may not compress all contacts a distance sufficient for mating. Additional or final compression is required. This additional compression occurs after upper substrate 18 has been moved down through the normal collapse distance and increases the normal force exerted on the clamp tooling, substrates and assembly by the compressed contacts.

Figure 15:
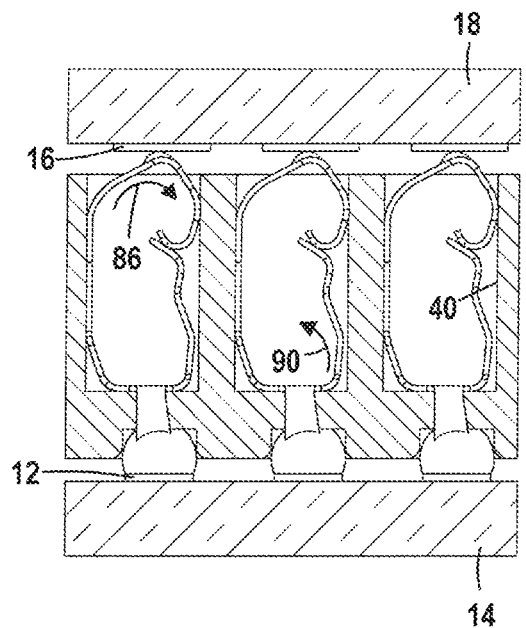
Figure 16:
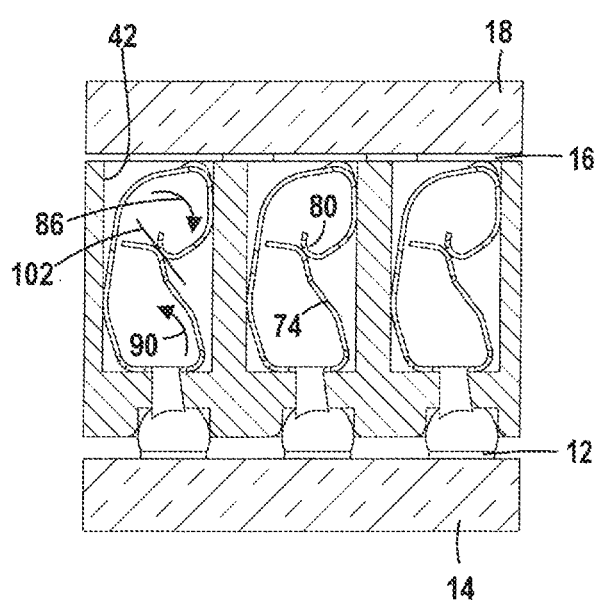

During final vertical compression of contacts 54 from the position of FIG. 15 to the position of FIG. 16, strips 74 are rotated in counterclockwise directions 90 into passages 26, and rounded ends 80 slide further along the upper ends of strips 74 down into the passages at an angle 102 of about 50° to the horizontal. Angle 102 increases during compression. Strips 74 freely bend away from walls 40 and into passages 26 during final compression. Angle 102 is greater than angle 100, so that the compression spring rate is reduced during final compression, and the substrate is lowered onto the plate.

Reduction of the compression spring rate during final compression reduces the rate at which the clamp force increases during the final compression. Reduction in the rate of increase of the clamp force means that the clamping tooling to close the assembly does not need to be as massive and strong as would be required if the spring rate were not reduced. The final downward movement of the substrate from the position of FIG. 15 to the fully clamped position of FIG. 16 where it engages the top of plate 22 additionally collapses the contacts to make sure that each contact forms a reliable connection between the opposed pads on the substrates despite possible plate bowing and dimensional differences due to manufacturing tolerances.

During initial and final compression of the contacts, bases 56 are held in place in the bottoms of passages 26.

An alternate embodiment compression contact 200 for use in interposer assembly 10 is shown in FIGS. 21-28.

Contact 200 is formed from strip metal stock as disclosed above and has a generally C-shape.

Contact 200 includes a flat, base or spine 210 with a slightly rounded, upper contact support 212 and a slightly rounded lower contact support 214 at the upper and lower ends of base or spine 210.

A first, upper cantilever spring arm 220 angles upwardly and inwardly from contact support 212 to contact top 222. A second upper cantilever spring arm 224 extends from contact top 222 downwardly to rounded arm upper end 226.

Contact 200 is generally vertically symmetrical to either side of the center of spine 210, so that the contact has a first lower cantilever spring arm 228 that angles downwardly and inwardly from lower contact support 214 to contact bottom 230 and a second lower cantilever spring arm 228 that extends to rounded arm lower end 232.

Contact central spine 210, upper contact support 212, lower contact support 214, first upper spring arm 220 and first lower spring arm 228 comprise a continuous one-piece metal conductor 234 that extends from contact bottom 230 to contact top 222.

Second upper spring arm 224 and second lower spring arm 228 comprise a discontinuous two-piece metal conductor 236 that extends from contact bottom 230 to contact top 222.

Contact 200 includes upper contact slot 240 and lower contact slot 242.

Upper contact slot 240 extends generally upwardly from spine 210, through contact support 212, first upper spring arm 220 and contact top 222 to second upper spring arm 224. Vertically symmetrical lower contact slot 242 extends generally downwardly from spine 210, through contact support 214, first lower spring arm 228, and contact bottom 230 to second lower spring arm 228.

Upper contact slot 240 includes upper slot edges 244 extending along upper slot 240 and away from contact sides 238. Likewise, lower contact slot 240 includes lower slot edges 246 extending along lower contact slot 242 and away from contact sides 238.

As indicated, contact 200 is generally flat, having a generally uniform thickness between opposed contact sides 238.

A pair of upper contact points 250 are located at contact top 222 adjacent upper contact slot 240. Contact points 250 are located at the interior of contact 200, away from contact sides 238. Upper contact points 250 extend upwardly and away from spine 210 and contact top 222. Upper contact points 250 are formed along upper slot edges 244 and are generally continuous with upper slot edges 244.

A pair of lower contact points 252 are located at contact bottom 230 adjacent lower contact slot 242. Contact points 250 are located at the interior of contact 200, away from contact sides 238. Lower contact points 252 extend downwardly and away from spine 210 and contact bottom 230. Lower contact points 252 are formed along lower slot edges 246 and are generally continuous with lower slot edges 246.

FIGS. 27-28 provide sectional views of an interposer assembly 10 having alternate embodiment compression contact 200. Upper substrate 18 is positioned above plate 22 with contact pads 16 above contacts 200 in passages 26 in plate 22. Contact top 222 extends above plate top surface 32 and contact bottom 230 extends below plate bottom surface 34.

Upper substrate 18 is then moved vertically down so that pads 16 engage upper contact points 250 of contact 200 and pads 12 engage lower contact points 252 of contact 200. At full compression, rounded arm upper end 226 and rounded arm lower end 232 engage each other to allow discontinuous two-piece metal conductor 236 to form an electrical connection between contact top 222 and contact bottom 230.

Figure 29:
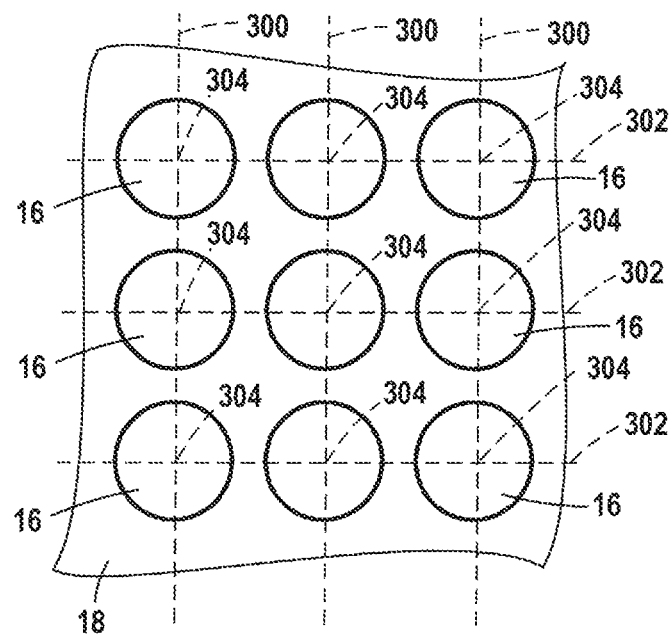
FIG. 29 is a top view of a substrate with contact pads for forming electrical contacts in the interposer assembly.

FIG. 29 shows a contact surface of an upper substrate 18 having pads 16 arranged in land grid array rows and columns. Pad vertical and horizontal center lines 300, 302 define pad center points 304 on each pad 16. Lower substrate 14 has a similar configuration of pads 12.

Figure 30:
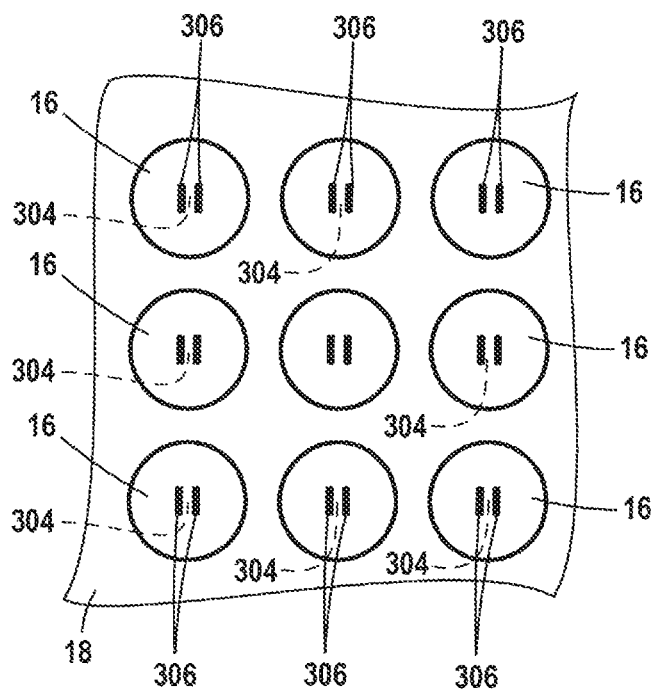
FIG. 30 is a view like FIG. 29 showing wipe traces on the contact pads of the substrate.

The disclosed pair of contact points 58 of contact 54, as well as the disclosed pair of upper contact points 250 and lower contact points 252 of contact 200, wipe along pads 16 or 12 to form a pair of wipe traces 306 as shown in FIG. 30. Each pair of wipe traces 306 are located proximate pad center points 304 and extend generally parallel to pad vertical center line 300. The resiliency of the stressed contact biases the contact points 58, 250, 252 against the contact pads under high pressure as the points are moved along traces 306 resulting in redundant high-pressure electrical connections between the points and pads. Contact pressures are high due to low contact areas. High-pressure wiped engagement between contact points 58, 250, 252 and pads 16 breaks through any debris, oxides or other surface contaminants on the points or on the pads. The provision of redundant contacts at the ends of contacts 54 and 200, as well as the location of contact points 58, 250, 252 proximate the center 304 of each contact pad increases the reliability of electrical connections between the contact and the substrate pads.

Interposer assembly 10 provides a number of advantages over prior art systems.

Use of contacts 54, 200 having elongate slots 72, 240, 242 extending along a contact cantilever arm toward a contact end offers mechanical performance advantages in interposer assembly 10. Specifically, the elongate slots allow for the reduction of spring forces produced by each cantilever arm as well as a longer arm travel path during arm deflection at installation of the interposer assembly to substrates 14, and 18. This allows for adjustment and minimization of overall normal forces generated at interposer assembly installation to substrates 14, 18.

Use of a pair of solder tabs 60 provides performance advantages in interposer assembly 10. The use of two tabs allows for improved impedance tuning/matching for the overall circuit system as well as allows improved mechanical strength for the connection between tabs 60 and solder ball 84.

The use of a solder recess or pocket 48 is located in plate bottom surface 34 at the bottom of plate bottom surface 34 allows for improved execution of soldering reflow techniques to form soldered electrical connections in assembly 10. Solder recess or pocket 48 reduces the risk of undesired bridging between adjacent solder balls 84.

Use of contacts 54, 200 having contact points 58, 250, 252, located at slot edges offers a number of performance advantages in interposer assembly 10. First, this allows for the use of smaller contact pads 12, 16 in the assembly. The smaller sizes of pads 12, 16 allows for improved signal integrity performance of the overall circuit system by reducing insertion loss and cross talk and allowing for improved impedance tuning/matching. The use of smaller contact pads 12, 16 also allows for the use of wider trace paths for routing on substrate printed circuit board.

While one or more embodiments of the assembly have been disclosed and described in detail, it is understood that this is capable of modification and that the scope of the disclosure is not limited to the precise details set forth, but includes modifications obvious to a person of ordinary skill in possession of this disclosure, and also such changes and alterations as fall within the purview of the following claims.

The invention claimed is:

1. An interposer assembly for forming redundant electrical connections with contact pads on substrates positioned above and below the assembly, the assembly comprising:
   an insulating plate having top and bottom sides and a plurality of passages extending through the thickness of the plate, each passage having a pair of opposed parallel sidewalls; and
   a plurality of metal contacts, each contact having a uniform thickness, each contact disposed in one of said passages and having a pair of opposed contact sides, each contact comprising a first cantilever spring arm extending from a contact base located within a passage to a contact end located within the passage and proximate a passage sidewall, the first cantilever spring arm comprising a pair of strips defining a first contact slot, each said strip extending a non-uniform strip width extending between said contact side and a slot edge, each said slot edge proximate said contact slot said first contact slot extending from within the passage along the first cantilever spring arm and outside the passage.

2. The interposer assembly of claim 1 wherein each said strip is v-shaped.

3. The interposer assembly of claim 2 wherein said first contact slot comprises a non-uniform slot width extending between opposed said slot edges.

4. The interposer assembly of claim 3 wherein said first contact slot has an elongate oval shape.

5. The interposer assembly of claim 4 wherein the first cantilever spring arm further comprising a first pair of contact points located outside the passage, each contact point located proximate a said slot edge and away from a said contact side.

6. The interposer assembly of claim 5 wherein the first cantilever spring arm is curved.

7. The interposer assembly of claim 6 wherein a first pair of contact points is located above the plate.

8. The interposer assembly of claim 7 wherein each contact point is continuous with the first slot edges.

9. The interposer assembly of claim 8 wherein the contact comprises a second cantilever spring arm extending from the contact base and away from the first cantilever spring arm, the second cantilever spring arm extending to a contact end located within the passage and proximate a passage sidewall, the second cantilever spring arm comprising a second contact slot, the second contact slot comprising a pair of strips defining a second contact slot, each said strip extending a non-uniform strip width between said contact side and a slot edge, each said slot edge proximate said second contact slot, said second contact slot extending from within the passage along the second cantilever spring arm and outside the passage.

10. The interposer assembly of claim 8 wherein the contact comprises one or more solder tabs joined to the contact base, the solder tabs located proximate the bottom side of the plate, the solder tabs joined to a solder ball proximate the plate bottom side.

11. The interposer assembly of claim 10 wherein one or more passages comprise a passage bottom wall located between the plate top and bottom sides and extending between said sidewalls, one or more tab passages extending through the passage bottom wall to a solder pocket located proximate the plate bottom side, said one or more solder tabs said first contact slot extending from within the passage along the first cantilever spring arm and outside the passage located in said one or more tab passages, said solder ball located in said solder pocket.

12. The interposer assembly of claim 11 wherein said solder pocket comprises a solder pocket mouth larger than said solder pocket.

13. An interposer assembly for forming electrical connections between contacts on opposed substrates, the assembly comprising an insulating plate having a top surface, a bottom surface, a thickness between the top surface and the bottom surface and a number of through passages, each passage having a pair of opposed parallel sidewalls; a plurality of one-piece conductive contacts members, each contact member having a uniform thickness and opposed contact sides, each contact member extending generally from a contact top to a contact bottom and comprising a contact base in a through passage, a first cantilever spring arm extending from the base to a first contact end, a second cantilever spring arm extending from the base to a second contact end, the first cantilever spring arm comprising first and second spring arm strips, each spring arm strip extending a non-uniform width between a contact side and a slot edge, said first and second strips defining a first slot extending through the contact member, the first slot located between the opposed contact sides and proximate the contact top, the contact base and first cantilever spring arm comprising a continuous one-piece metal conductor extending from the contact top to the contact bottom and proximate a first passage sidewall.

14. The interposer assembly of claim 13 wherein the first and second spring arm strips are V-shaped.

15. The interposer assembly of claim 14 wherein the first slot comprises a non-uniform slot width extending between opposed said slot edges.

16. The interposer assembly of claim 15 wherein the first slot has an elongate oval shape.

17. The interposer assembly of claim 16 wherein the first slot comprises a pair a pair of top contact points, each top contact point adjacent a slot edge and extending away from the contact member and contact top.

18. The interposer assembly of claim 17 wherein the first cantilever spring arm and the second cantilever spring arm comprise a discontinuous two-piece metal conductor extending from the contact top to the contact bottom and proximate a second passage sidewall opposed to said first passage sidewall.

19. The interposer assembly of claim 18 wherein the contact top is located above the insulating plate top surface.

20. The interposer assembly of claim 19 wherein each top contact point is continuous with a first slot edge.

21. The interposer assembly of claim 20 wherein the second cantilever spring arm comprises a second slot extending through the contact member.

22. The interposer assembly of claim 21 wherein the contact bottom is located below the insulating plate bottom surface.

23. The interposer assembly of claim 20 wherein the contact comprises two solder tabs joined to the contact base, the solder tabs located proximate the contact bottom and joined to a solder ball proximate and engaging the bottom side of the plate.

24. The interposer assembly of claim 23 wherein one or more passages comprise a passage bottom wall located between the plate top and bottom sides and extending between said sidewalls, two tab passages extending through the passage bottom wall to a solder pocket located proximate the plate bottom side, each solder tabs located a tab passage, said solder ball located in said solder pocket.

25. The interposer assembly of claim 24 wherein said solder pocket comprises a solder pocket mouth larger than said solder pocket.

26. An interposer assembly for forming electrical connections between contacts on opposed substrates, the assembly comprising an insulating plate having a top surface, a bottom surface, a thickness between the top surface and the bottom surface and a number of through passages, each passage comprising a pair of opposed sidewalls, a plurality of one-piece conductive contacts members, each contact member located in a through passage and each contact member comprising a uniform thickness, opposed contact sides, a contact base, a first cantilever spring arm extending from the contact base to a contact top and to a first contact end, the first cantilever spring arm comprising a pair of contact strips, the pair of contact strips comprising a pair of slot edges extending through the contact member slot edge, the slot edges defining a contact slot having a non-uniform slot width extending between opposed slot edges, the contact base and first cantilever spring arm comprising a continuous one-piece conductor extending from the contact top to the contact bottom and proximate a first passage sidewall.

27. The interposer assembly of claim 26 wherein the slot edges are V-shaped.

28. The interposer assembly of claim 27 wherein each contact strip comprises a non-uniform strip width extending between a contact side and a contact edge.

29. The interposed assembly of claim 28 wherein the contact slot comprises an elongate oval shape.

30. The interposed assembly of claim 29 wherein each slot edge comprises a contact point, each contact point extending away from the contact member and contact top, said contact point located above the plate top surface.

31. The interposer assembly of claim 30 wherein the contact comprises a second cantilever spring arm extending from the contact base, the second cantilever spring arm extending to a second contact end, the first cantilever spring arm and the second cantilever spring arm comprising a discontinuous two-piece metal conductor extending from the contact top to the contact bottom and proximate a second passage sidewall opposed to said first passage sidewall.

32. The interposer assembly of claim 31 wherein the second cantilever spring arm comprises a second pair of contact strips, the second pair of contact strips comprising a second pair of slot edges extending through the contact member slot edge, each second slot edge defining a second contact slot.

33. The interposer assembly of claim 31 wherein the contact comprises two solder tabs joined to the contact base, the solder tabs located proximate the contact bottom.

34. The interposer assembly of claim 33 wherein one or more passages comprise a passage bottom wall located between the plate top and bottom sides and extending between said sidewalls, two tab passages extending through the passage bottom wall to a solder pocket located proximate the plate bottom side, each solder tabs located in a tab passage, said solder ball located in said solder pocket.

35. The interposer assembly of claim 34 wherein said solder pocket comprises a solder pocket mouth larger than said solder pocket.

\* \* \* \* \*